(12) United States Patent
Lee et al.

(10) Patent No.: US 6,292,300 B1
(45) Date of Patent: Sep. 18, 2001

(54) APPARATUS FOR GENERATING INDEPENDENT COHERENT BEAM ARRAY USING 45-DEGREE MIRRORS

(75) Inventors: Sukhan Lee, Seongnam; Jideog Kim, Seoul; In Young Lee, Suwon, all of (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/562,888

(22) Filed: May 1, 2000

(30) Foreign Application Priority Data

Oct. 4, 1999 (KR) .................................. 99-42595

(51) Int. Cl.[7] ............................ G02B 27/10; G02B 27/30
(52) U.S. Cl. ............................................ 359/627; 359/641
(58) Field of Search .................................. 359/619, 627, 359/618, 212, 214, 220, 221, 223, 226, 292, 641, 642, 838, 850, 855, 856, 857, 872, 873, 876; 345/111; 348/771

(56) References Cited

U.S. PATENT DOCUMENTS

| 3,989,890 | * | 11/1976 | Nathanson | 348/771 |
| 4,988,153 | | 1/1991 | Paek | 359/15 |
| 5,729,386 | * | 3/1998 | Hwang | 359/618 |
| 5,748,172 | * | 5/1998 | Song | 345/111 |
| 5,818,627 | * | 10/1998 | Perlo | 359/292 |

* cited by examiner

*Primary Examiner*—Georgia Epps
*Assistant Examiner*—Gary O'Neill
(74) *Attorney, Agent, or Firm*—Burns, Doane, Swecker & Mathis, L.L.P.

(57) ABSTRACT

An apparatus for generating a coherent beam array from a single light source using independently switchable 45-degree mirrors. In the independent coherent beam array generating apparatus, multiple coherent beams can be generated from a single light source by selectively rotating micro mirrors of two mirror arrays.

6 Claims, 6 Drawing Sheets

APPARATUS FOR GENERATING INDEPENDENT COHERENT BEAM ARRAY USING 45-DEGREE MIRRORS

The present application is based on Korean Application No. 99-42595 filed on Oct. 4, 1999, herein incorporated by reference.

BACKGROUND OF THE INVENTION

1. Field of the Invention

The present invention relates to an apparatus for generating an independent coherent beam array from a single light source, and more particularly, to an apparatus for generating an independent coherent beam array in which beams are independently switched using 45-degree mirrors for recording and read-out operations.

2. Description of the Related Art

FIG. 1 illustrates a conventional coherent beam array adapted in a holographic memory, which has been suggested in U.S. Pat. No. 4,988,153. In the coherent beam array, a plurality of vertical cavity surface emitting laser (VCSEL) diodes 14 form a two-dimensional laser diode array 12 as a light source. An XY selector 16 allows for selective electrical activation of a single or several VCSEL diodes in sequence.

The output beam from the selected VCSEL diode is converted into a collimated beam by a collimating lens 20. The position of the selected VCSEL diode, the X-Y coordinate of the selected VCSEL diode on the two-dimensional laser diode array 12, causes a small change in the incident angle of the collimated beam upon a holographic recording medium 10.

Images can be written to or read from the holographic recording medium 10 by collimated beams generated from the coherent beam array. During recording, an image 40 is presented on an image light source 42 and is recorded through a recording collimating lens 46 on the recording medium 10. The writing angle $\theta_W$ between the collimated beams respectively from the collimating lens 42 and the recording collimating lens 46, which are incident upon the recording medium 10, is varied, which allows multiple independent images to be superimposed and sequentially written to the recording medium 10. Although not illustrated, during reading, images recorded on the recording medium 10 are read out only by the collimated beam, of which the incident angle upon the recording medium 10 for reading is the same as that of the reference collimated beam.

The coherent beam array generating apparatus having the above-mentioned configuration can be applied to holographic information storing devices or displays, for optical interconnections therein, which require several tens to several hundreds of light sources. The manufacture of the VCSEL 12 is technically difficult, particularly in controlling the heat generated from laser diodes thereof and in maintaining the uniformity in the intensity of laser beams as well as the irradiation angle of the laser beams, which increases the manufacturing cost and produces a low yield.

SUMMARY OF THE INVENTION

To solve the above problems, it is an object of the present invention to provide an apparatus for generating an independent coherent beam array from a single light source, in which coherent beams can be independently activated using 45-degree mirrors for recording and read-out operations.

The above object of the present invention is achieved by an apparatus for generating an independent coherent beam array using 45-degree mirrors, comprising: a single light source; a collimating lens for collimating the beam emanated from the light source; a first mirror array having a plurality of rotatable micro mirrors vertically positioned linearly on an optical path of the collimated beam from the collimating lens, for reflecting the collimated beam from the collimating lens by 90 degrees; and a second mirror array having a plurality of 45-degree rotatable micro mirrors laid flat on the same plane with the first mirror array, a predetermined number of 45-degree rotatable micro mirrors of the second mirror array being positioned in a row for each micro mirror of the first mirror array, for reflecting the collimated beam reflected by the first mirror array at a right angle to the optical path of the collimated beam reflected by the first mirror array.

Preferably, the light source is a laser diode, a light emitting diode, or a light beam guided by an optical fiber.

In another embodiment, the first mirror array may have a plurality of micro mirrors positioned linearly at an angle of 45 degrees with respect to the optical path of the collimated beam from the collimating lens, beside the optical path of the collimated beam from the collimating lens, the micro mirrors being movable toward the second mirror array to reflect the collimated beam from the collimating lens by 90 degrees toward the second mirror array.

Preferably, individual micro mirrors of the second mirror array are rotatable by 45 degrees. Preferably, individual micro mirrors of the first and second mirror arrays are turned on at 45 degrees to the corresponding optical path and are turned off at 0 degrees to the corresponding optical path.

BRIEF DESCRIPTION OF THE DRAWINGS

The above object and advantages of the present invention will become more apparent by describing in detail preferred embodiments thereof with reference to the attached drawings in which.

DETAILED DESCRIPTION OF THE INVENTION

Figure 1:
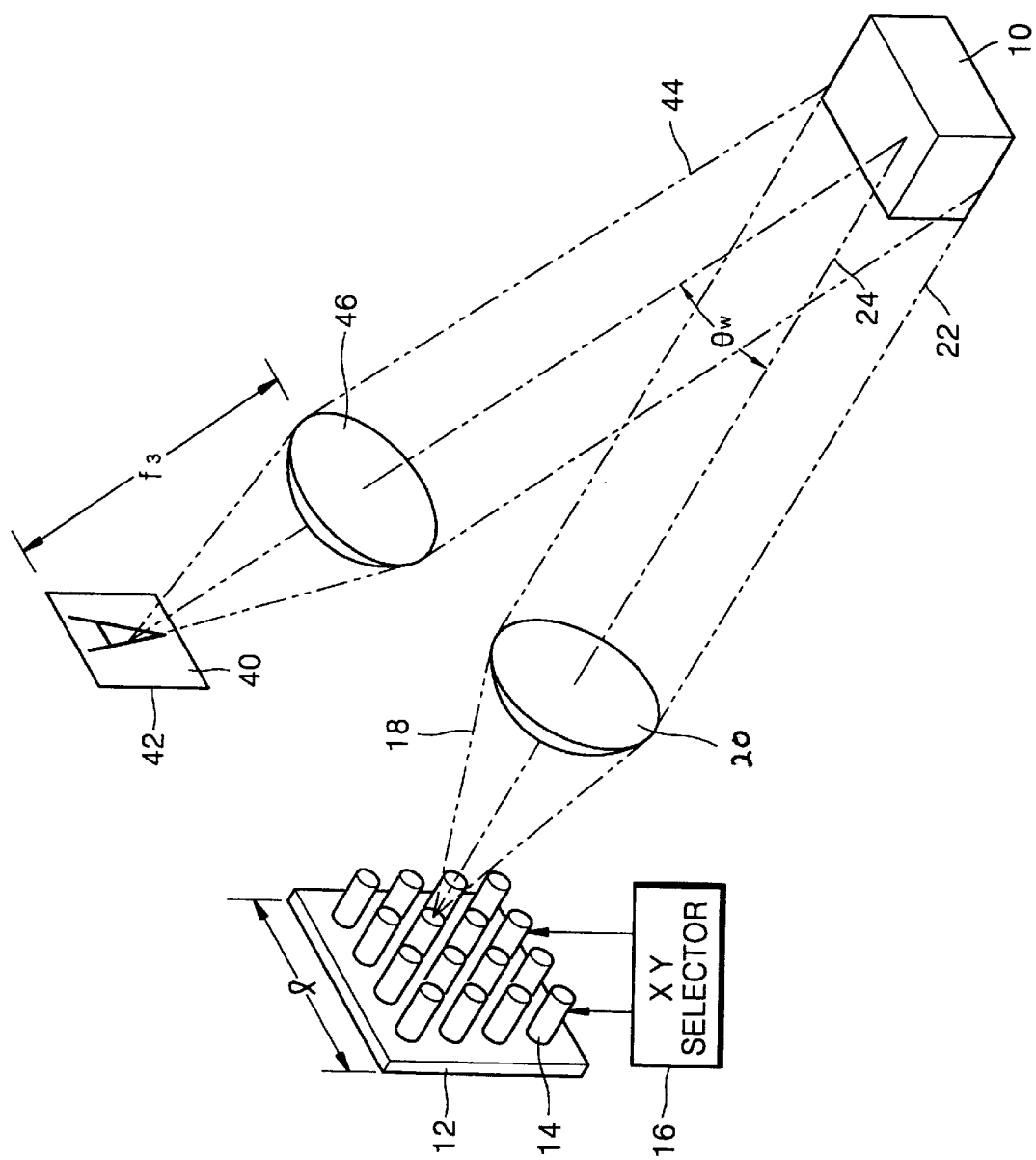
FIG. 1 is a schematic view of a conventional apparatus for generating an independent coherent beam array.
Figure 2:
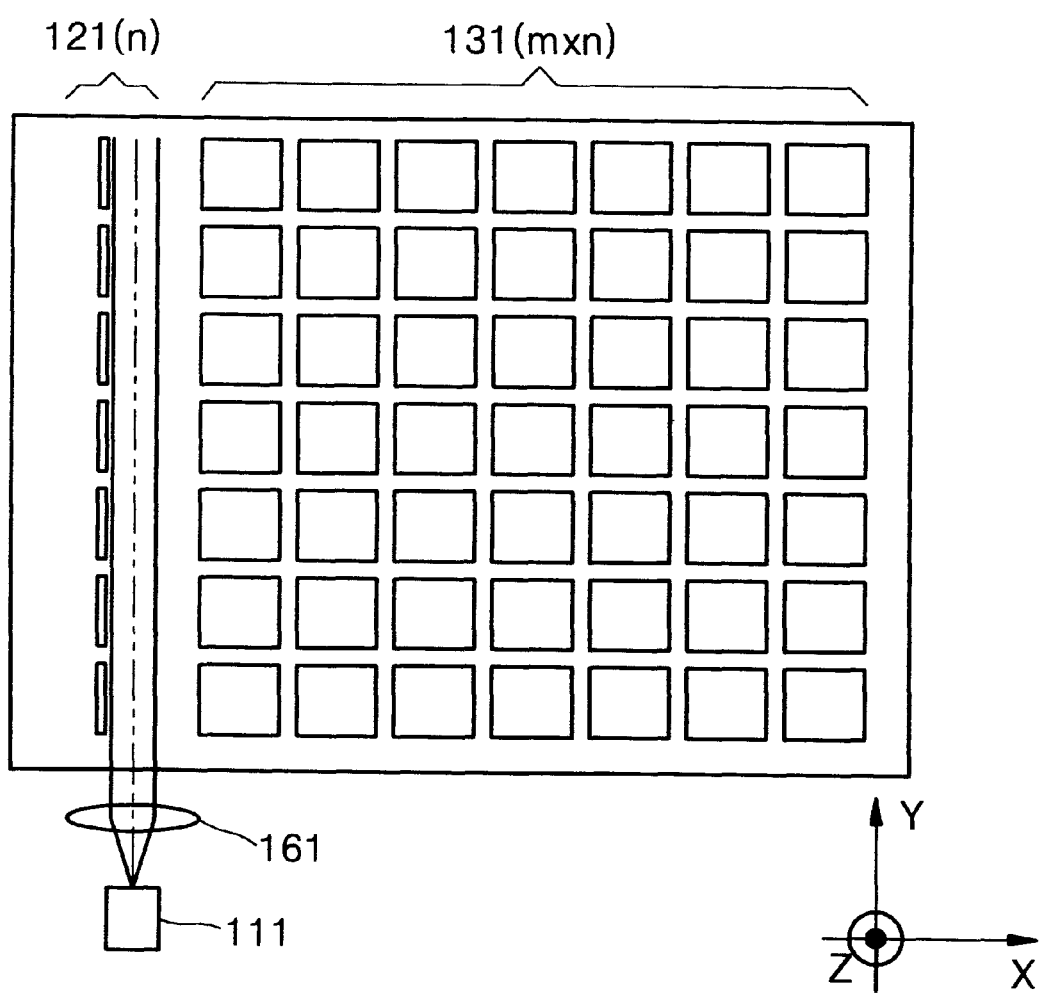
FIG. 2 is a schematic view of an embodiment of an apparatus for generating an independent coherent beam array using 45-degree mirrors according to the present invention.

Referring to FIG. 2, an apparatus for generating an independent coherent beam array using 45-degree mirrors according to the present invention. As shown in FIG. 2, the independent coherent beam array generating apparatus using 45-degree mirrors includes a single light source 111, a collimating lens 161 for collimating the beam from the light source 111, a first mirror array 121 of a plurality of micro mirrors vertically positioned linearly on the optical path of the collimated beam from the collimating lens 161, for reflecting the collimated beam by 90 degrees, and a second mirror array 131 of a plurality of micro mirrors laid flat on the same plane as the first mirror array 121, a predetermined number of 45-degree rotatable micro mirrors of the second mirror array being positioned in a row for each micro mirror of the first mirror array 121.

For example, when the first mirror array 121 has n micro mirrors arranged along the optical axis of the light source 111, i.e., in the Y-axis direction in FIG. 2, the second mirror array 131 has m micro mirrors for each of the micro mirrors of the first mirror array 121, which are laid flat side-by-side on the same plane (XY plane), i.e., in the X-axis direction in FIG. 2, forming an m×n array.

Figure 3A:
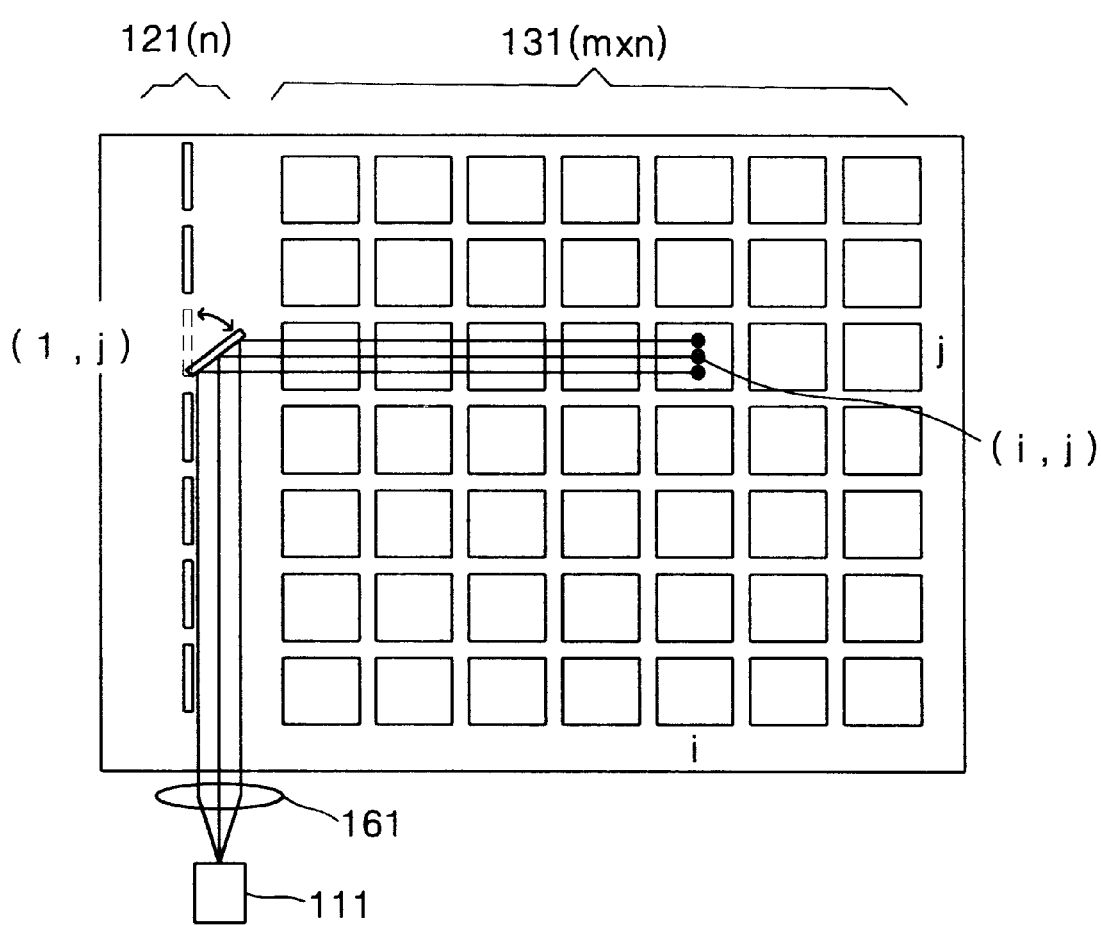
FIGS. 3A and 3B are diagrams illustrating the configuration and operation of preferred embodiments of the independent coherent beam array generating apparatus using 45-degree mirrors according to the present invention.

Referring to FIG. 3A, the first mirror array 121 is constructed such that each micro mirror thereof is rotatable by −45 degrees on the XY plane around the Z-axis to change the optical path of the collimated beam from the collimating lens 161 by 90 degrees, i.e., into the X-axis direction. The second mirror array 131 is constructed such that each micro mirror thereof is rotatable by −45 degrees on the ZX plane around the Y-axis to change the optical path of the collimated beam from the first mirror array 121 by 90 degrees, i.e., into the Z-axis direction. However, the optical path of the output beam from the second mirror array 121 is not limited to just Z-axis direction, and may be in a direction having a predetermined angle to the Y-axis. Preferably, the first mirror array 121 and the second mirror array 131 are constructed such that each micro mirror thereof is turned off at 0 degrees and is turned on at 45 degrees to the corresponding optical axis.

The above-mentioned configuration allows for a two-dimensional independent coherent beam array. For a one-dimensional independent beam array, either the first mirror array 121 or the second mirror array 131 can be selected for a beam array generating apparatus. In addition, the single light source 111 may be a laser diode, a light emitting diode, or a light beam guided through an optical fiber.

The operation of the independent coherent beam array generating apparatuses using 45-degree mirrors according to the present invention will now be described with reference to FIGS. 3A and 3B.

Assuming that when a micro mirror (i,j) must be activated for a pixel, for the beam array generating apparatus of FIG. 3A, the micro mirror (1,j) of the first mirror array 121 is rotated by −45 degrees on the XY plane around the Z-axis so that the optical path of the collimated beam is changed by 90 degrees and is directed in the X-axis direction. Then, the micro mirror (i,j) of the second mirror array 131 is rotated by −45 degrees on the ZX plane around the Y-axis to receive the collimated beam reflected by the micro mirror (1,j) of the first mirror array 121, and changes the optical path of the collimated beams by 90 degrees along the Z-axis direction.

Figure 3B:
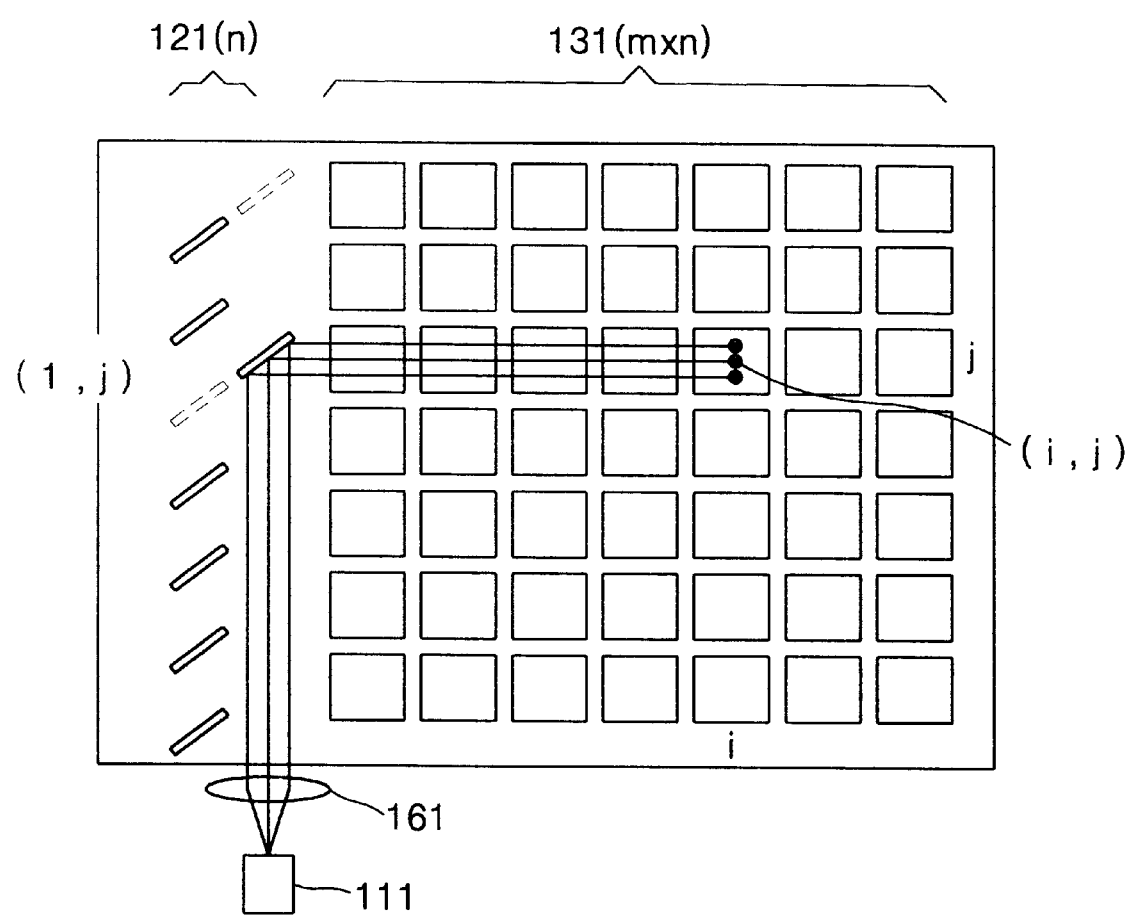

Alternatively, the beam array generating apparatus according to the present invention is constructed as shown in FIG. 3B, in which the micro mirrors of a first mirror array 121' are vertically positioned linearly at an angle of 45 degrees with respect to the optical path of the collimated beam from the collimating lens 161, beside the optical path of the collimated beam, rather than on the optical path thereof, and individual micro mirrors of the first mirror array 121' are movable onto the optical path of the collimated beam to change the optical path of the collimated beam by 90 degrees toward the second mirror array 131. In the operation of the beam array generating apparatus shown in FIG. 3B, the micro mirror (1,j) of the first mirror array 121', which is arranged at a 45-degree angle with the optical path of the collimated beam from the light source 111, beside the optical path of the same collimated beam, is moved onto the optical path of the collimated beam from the collimating lens 161 to receive and reflect the collimated beam by 90 degrees toward the second mirror array 131 along the X-axis direction. When a micro mirror of the first mirror array 121' is located beside the optical path of the collimated beam from the collimating lens 161, the collimated beam cannot be reflected by 90 degrees.

Figure 4:
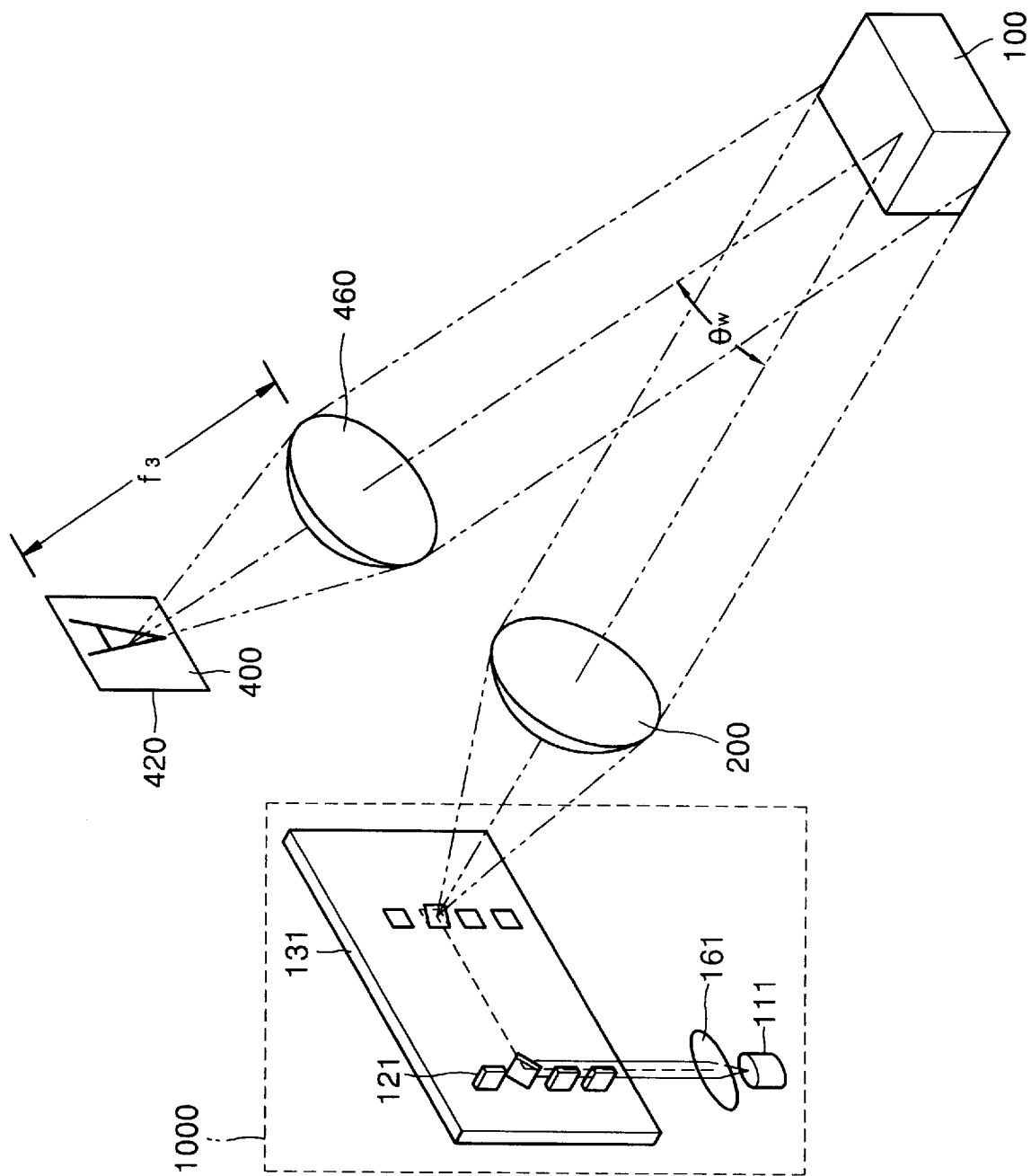
FIGS. 4 and 5 are diagrams illustrating the configuration of a holographic memory adopting the independent coherent beam array generating apparatus with 45-degree mirrors of FIG. 2, for recording and reading operations, respectively.
Figure 5:
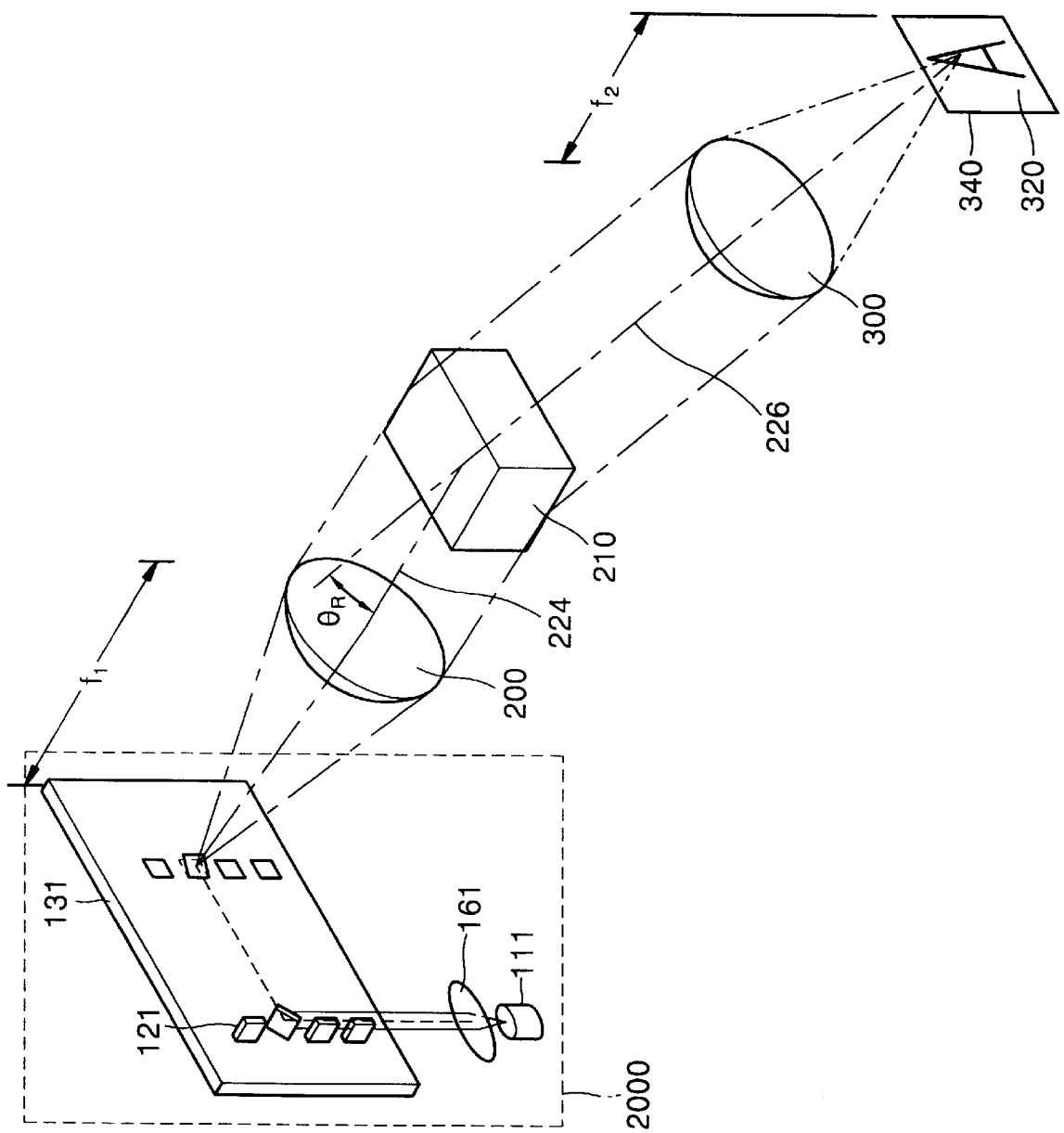

FIGS. 4 and 5 illustrate a holographic memory adopting an independent coherent beam array generating apparatus using 45-degree mirrors according to the present invention, for recording images on a holographic recording medium 100 and reading images from a holographic recording medium 210, respectively. Referring to FIG. 4, an image 400 presented on an image light source 420 is written through a recording collimating lens 460 of a focal length $f_3$ to the holographic recording medium 100 by the interference between the image collimated beam from the image light source 420 and the reference collimated beam, which is obtained by cooperation of the independent coherent beam array generating apparatus 1000 with 45-degree mirrors, other small mirrors (not shown) and a collimating lens 200. Also, by varying the writing angle $\theta_W$ between the two collimated beams originated from the light source 111 and the image light source 420, different images are superimposed and written to the holographic recording medium 100, which results in a high-density image recording.

As shown in FIG. 5, for the reading operation of the independent coherent beam array generating apparatus according to the present invention, images recorded on the holographic recording medium 210 are read and displayed according to the incident angle $\theta_R$ of the reference collimated beam for reading, which is obtained by cooperation of the independent coherent beam array generating apparatus 2000 with 45-degree mirrors, other small mirrors (not shown) and the collimating lens 200. The images can be read selectively by only the reference collimated beam incident onto the holographic recording medium 210, of which the incident angle $\theta_R$ for reading, i.e., the angle between a reference optical axis 224 and an image optical axis 226, is the same as that of the reference beam for recording. Then, the images read from the holographic recording medium 210 are sequentially displayed as an image 320 on an imaging plane 340 through a focusing lens 300 of a focal length $f_2$. In FIG. 5, $f_1$ denotes the focal length of the collimating lens 200.

As described above, the independent coherent beam array generating apparatus according to the present invention provides for multiple coherent beams from a single light source by selectively rotating micro mirrors of its two mirror arrays. Also, the intensity of the light beam from the single light source can be maintained for the multiple coherent beam array, increasing the efficiency of use of the light source. The two-dimensional planar arrangement of the mirror arrays allows for a small and thin structure. In particular, a desired number of beams can be generated from a single light source by adjusting the number of micro mirrors of the mirror arrays. Regardless of the number of light sources required in various applications, once the beam array generating apparatus according to the present invention is adopted to the applications, the desired function of the applications can be implemented at low cost. In addition, the structure and the assembly of the system is simple.

While this invention has been particularly shown and described with reference to preferred embodiments thereof, it will be understood by those skilled in the art that various changes in form and details may be made therein without departing from the spirit and scope of the invention as defined by the appended claims.

What is claimed is:

1. An apparatus for generating an independent coherent beam array, comprising:
   a single light source;
   a collimating lens for collimating the beam emanated from the light source;
   a first mirror array having a plurality of rotatable micro mirrors vertically positioned linearly on an optical path of the collimated beam from the collimating lens, for reflecting the collimated beam from the collimating lens by 90 degrees; and a second mirror array having a plurality of 45-degree rotatable micro mirrors laid flat on the same plane with the first mirror array, a predetermined number of 45-degree rotatable micro mirrors of the second mirror array being positioned in a row for each micro mirror of the first mirror array, for reflecting the collimated beam reflected by the first mirror array at a right angle to the optical path of the collimated beam reflected by the first mirror array.

2. The apparatus of claim 1, wherein the light source is a laser diode, a light emitting diode, or a light beam guided by an optical fiber.

3. The apparatus of claim 1, wherein the first mirror array has a plurality of micro mirrors positioned linearly at an angle of 45 degrees with respect to the optical path of the collimated beam from the collimating lens, beside the optical path of the collimated beam from the collimated lens, and the micro mirrors are movable toward the second mirror array to reflect the collimated beam from the collimating lens by 90 degrees toward the second mirror array.

4. The apparatus of claim 1, wherein individual micro mirrors of the second mirror array are rotatable by 45 degrees.

5. The apparatus of claim 1, wherein individual micro mirrors of the first and second mirror arrays are turned on at 45 degrees to the corresponding optical path and are turned off at 0 degrees to the corresponding optical path.

6. The apparatus of claim 4, wherein individual micro mirrors of the first and second mirror arrays are turned on at 45 degrees to the corresponding optical path and are turned off at 0 degrees to the corresponding optical path.

* * * * *